United States Patent
Kuo et al.

(10) Patent No.: US 9,654,059 B2
(45) Date of Patent: May 16, 2017

(54) APPARATUS AND METHOD FOR CONTROLLING IMPEDANCE TUNING BY USING HYBRID CONTROL ALGORITHM

(71) Applicant: MEDIATEK INC., Hsin-Chu (TW)

(72) Inventors: Ting-Hsuan Kuo, Changhua County (TW); Qiang Zhou, San Jose, CA (US); Ming-Chou Wu, Miaoli County (TW); Paul Cheng Po Liang, Hsinchu County (TW); Bernard Mark Tenbroek, West Malling (GB)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/854,054

(22) Filed: Sep. 15, 2015

(65) Prior Publication Data

US 2016/0126904 A1    May 5, 2016

Related U.S. Application Data

(60) Provisional application No. 62/072,447, filed on Oct. 30, 2014.

(51) Int. Cl.

| | | |
|---|---|---|
| H04B 1/04 | (2006.01) | |
| H03F 1/56 | (2006.01) | |
| H03F 3/19 | (2006.01) | |
| H03F 3/24 | (2006.01) | |
| H04B 1/18 | (2006.01) | |
| H04B 1/034 | (2006.01) | |

(52) U.S. Cl.
CPC .............. *H03F 1/56* (2013.01); *H03F 3/19* (2013.01); *H03F 3/245* (2013.01); *H04B 1/0458* (2013.01); *H04B 1/18* (2013.01); *H03F 2200/222* (2013.01); *H03F 2200/294* (2013.01); *H03F 2200/387* (2013.01); *H04B 2001/0416* (2013.01)

(58) Field of Classification Search
CPC .......... H04B 1/0458; H03F 1/56; H03H 11/28
USPC ......... 455/120, 121, 861, 123; 343/860, 861
See application file for complete search history.

(56) References Cited

U.S. PATENT DOCUMENTS

| | | | |
|---|---|---|---|
| 7,711,337 B2 | 5/2010 | Mckinzie, III | |
| 2008/0261540 A1* | 10/2008 | Rohani | H04B 1/406 455/77 |
| 2014/0327594 A1* | 11/2014 | Zhang | H03H 7/40 343/861 |

OTHER PUBLICATIONS

Gu, A New Method for Matching Network Adaptive Control, IEEE Transactions on Microwave Theory and Techniques, vol. 61, No. 1, pp. 587-595, Jan. 2013.

* cited by examiner

*Primary Examiner* — Lee Nguyen
(74) *Attorney, Agent, or Firm* — Winston Hsu; Scott Margo

(57) ABSTRACT

An impedance tuning control apparatus has a processing circuit and an output circuit. The processing circuit determines a first control setting according to a first performance metric, and performs a search operation with a search start point set by the first control setting to find a second control setting according to a second performance metric. The second performance metric is different from the first performance metric. The output circuit outputs a final control setting to a tuner, wherein the final control setting is derived from the second control setting.

29 Claims, 5 Drawing Sheets

APPARATUS AND METHOD FOR CONTROLLING IMPEDANCE TUNING BY USING HYBRID CONTROL ALGORITHM

CROSS REFERENCE TO RELATED APPLICATIONS

This application claims the benefit of U.S. provisional application No. 62/072,447, filed on Oct. 30, 2014 and incorporated herein by reference.

BACKGROUND

The disclosed embodiments of the present invention relate to controlling impedance matching, and more particularly, to an apparatus and method for controlling impedance tuning by using a hybrid control algorithm.

Antennas can be used to transmit radio frequency (RF) signals over the air when wireless communication devices are operated in the transmit (TX) mode. However, an antenna used in a wireless communication device (e.g., a mobile phone) may lose efficiency due to certain factors. For example, the impedance mismatch between the antenna and the front-end module may result in antenna performance loss. For another example, the human body (e.g., head and hand) may affect the antenna impedance, thus also resulting in antenna performance loss. In reality, the environmental condition of the wireless communication devices may vary from time to time, which greatly affects the antenna performance. When the antenna performance is degraded in the TX mode, a power amplifier is required to output an RF signal with a larger TX power to compensate the antenna loss. As a result, the current consumption of the power amplifier is increased. When the wireless communication device is a portable device powered by a battery, the battery life is short, which results in a bad user experience of using the wireless communication device.

Some of the lost antenna performance may be recovered with antenna tuning. The wireless communication device can use dynamic impedance tuning techniques to improve the antenna performance. However, the proper control of the antenna tuning is essential for the improvement of the antenna performance. If an antenna tuner is not properly controlled, the antenna may fail to have the desired performance gain. Thus, there is a need for an antenna tuning control scheme capable of properly configuring the antenna tuner to maximize the delivered power to the antenna.

SUMMARY

In accordance with exemplary embodiments of the present invention, an apparatus and method for controlling impedance tuning by using a hybrid control algorithm are proposed to solve the above-mentioned problem.

According to a first aspect of the present invention, an exemplary impedance tuning control apparatus is disclosed. The exemplary impedance tuning control apparatus includes a processing circuit and an output circuit. The processing circuit is configured to determine a first control setting according to a first performance metric, and perform a search operation with a search start point set by the first control setting to find a second control setting according to a second performance metric different from the first performance metric. The output circuit is configured to output a final control setting to a tuner, wherein the final control setting is derived from the second control setting.

According to a second aspect of the present invention, an exemplary impedance tuning control method is disclosed. The exemplary impedance tuning control method includes: determining a first control setting according to a first performance metric; performing a search operation with a search start point set by the first control setting to find a second control setting according to a second performance metric different from the first performance metric; and controlling a tuner based on a final control setting derived from the second control setting.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular elements. As one skilled in the art will appreciate, manufacturers may refer to a component by different names. This document does not intend to distinguish between elements that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
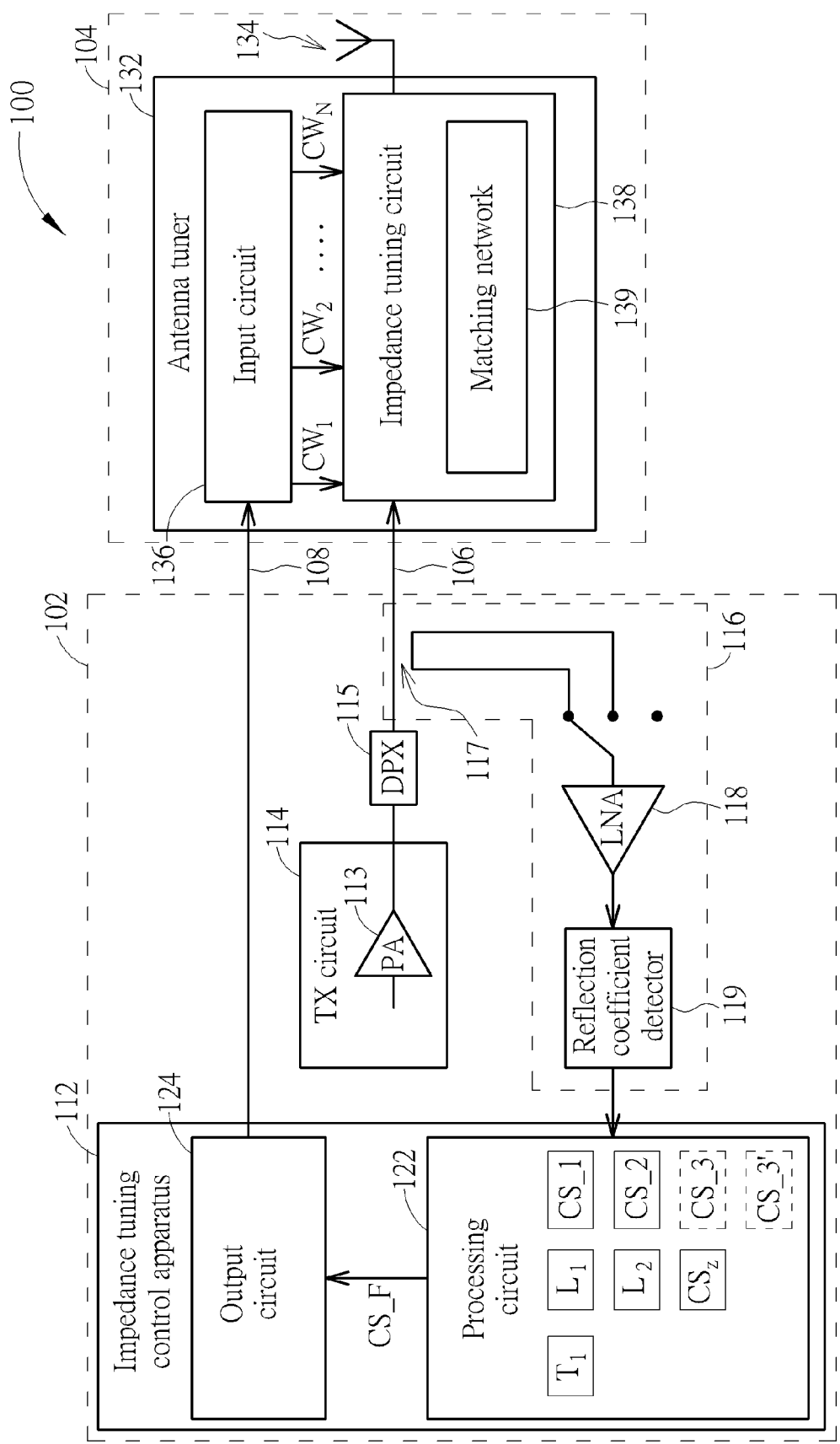
FIG. 1 is a diagram illustrating an impedance tuning control apparatus implemented in a wireless communication device according to an embodiment of the present invention.

FIG. 1 is a diagram illustrating an impedance tuning control apparatus implemented in a wireless communication device according to an embodiment of the present invention. For example, the wireless communication device 100 may be a mobile phone. It should be noted that only the components pertinent to the present invention are shown in FIG. 1. In practice, the wireless communication device 100 may have additional components to achieve other functions. As shown in FIG. 1, the wireless communication device 100 includes a printed circuit board 102 and an antenna assembly 104. The printed circuit board 102 has a plurality of circuit elements installed thereon. For example, an antenna tuning control apparatus 112, a TX circuit 114, a duplexer (DPX) 115, and a detection circuit 116 are installed on the printed circuit board 102. The antenna assembly 104 includes an antenna tuner 132 and an antenna 134.

The TX circuit 114 includes circuit elements needed to generate an RF signal with a specific TX power to the antenna tuner 132. For example, the TX circuit 114 has a power amplifier (PA) 113, and a PA output of the TX circuit 114 is transmitted to the antenna tuner 132 through the duplexer 115 and a transmission line 106. The duplexer 115 is a radio device that enables signal transmission and signal reception over a single antenna. The detection circuit 116 includes a coupler 117, a low-noise amplifier (LNA) 118, and a reflection coefficient detector 119.

The impedance tuning control apparatus 112 is used for antenna tuning, and includes a processing circuit 122 and an output circuit 124. For example, the processing circuit 122 may be a microcontroller or a digital signal processor (DSP). The processing circuit 122 is configured to employ a hybrid control algorithm to generate a final control setting CS_F to the antenna tuner 132 for antenna tuning. Specifically, the final control setting CS_F is dynamically updated by the processing circuit 122 for dynamic impedance tuning. For example, when antenna loading (e.g., phase and/or amplitude) or frequency band changes, the processing circuit 122 is operative to perform the hybrid control algorithm to determine a new final control setting CS_F for the antenna tuner 132. The output circuit 124 is configured to output the final control setting CS_F through an interface 108 such as a mobile industry processor interface (MIPI). It should be noted that an intermediate control setting (e.g., first control setting CS_1) may be involved in initializing a proposed local minimum search operation for good search performance, and is also sent to the antenna tuner 132 via the output circuit 124 to change the antenna tuner setting. Hence, the proposed local minimum search operation is performed with initialization given by the intermediate control setting (e.g., first control setting CS_1) applied to the antenna tuner 132.

Concerning the antenna tuner 132, it includes an input circuit 136 and an impedance tuning circuit 138. The impedance tuning circuit 138 may be implemented using a matching network 139, such as a switch-inductor-capacitor network with one or more tunable elements (e.g., tunable capacitors). Hence, any control setting, such as the final control setting CS_F or the first control setting CS_1, received by the input circuit 136 has values of a plurality of control words $CW_1, CW_2, \ldots CW_N$ used to control component values of the tunable elements, such as capacitance values of the tunable capacitors. It should be noted that the impedance tuning circuit 138 may be implemented using a different circuit structure, in which there could be variable capacitors or tunable switches or both of them. In addition, the number of tunable elements implemented in the impedance tuning circuit 138 may be adjusted, depending upon the actual design consideration. The impedance possessed by the impedance tuning circuit 138 should be properly controlled to maximize the delivered power to the antenna 134. In this embodiment, the processing circuit 122 employs two control algorithms to determine one final control setting CS_F for a current antenna loading. Further details of the processing circuit 122 are described as below.

The processing circuit 122 is configured to employ a first control algorithm for determining a first control setting CS_1 according to a first antenna performance metric, and employ a second control algorithm which performs a search operation with a search start point set by the first control setting CS_1 to find a second control setting CS_2 according to a second antenna performance metric, where the second antenna performance metric is different from the first antenna performance metric. The first control algorithm controls initialization of the second control algorithm. Hence, the first control setting CS_1 decides a search start point from which the second control algorithm starts searching for the second control setting CS_2. The final control setting CS_F is derived from the second control setting CS_2. For example, the second control setting CS_2 may be directly used as the final control setting CS_F.

For example, the first antenna performance metric may be a transducer gain (TG) or a relative transducer gain (RTG), and/or the second antenna performance metric may be a reflection coefficient amplitude/phase or a voltage standing wave ratio (VSWR). For another example, the processing circuit 122 may determine the first control setting CS_1 by performing analytical computation based on the first antenna performance metric; and/or the processing circuit 122 may determine the second control setting CS_2 by performing a local minimum search operation based on the second antenna performance metric.

For clarity and simplicity, the following assumes that the hybrid control algorithm employed by the processing circuit 122 includes an RTG-based search algorithm (i.e., the first control algorithm) and a VSWR-based search algorithm (i.e., the second control algorithm with initialization from the first control algorithm). It should be noted that any conventional means capable of calculating/measuring TG values, RTG values, VSWR values and reflection coefficient amplitude/phase values can be employed by the impedance tuning control apparatus 112. The present invention has no limitations on the TG computation/measurement, RTG computation/measurement, reflection coefficient amplitude/phase computation/measurement, and the VSWR computation/measurement. Further details directed to calculating/measuring RTG values and VSWR values used in the exemplary embodiments are omitted for brevity.

Figure 2:
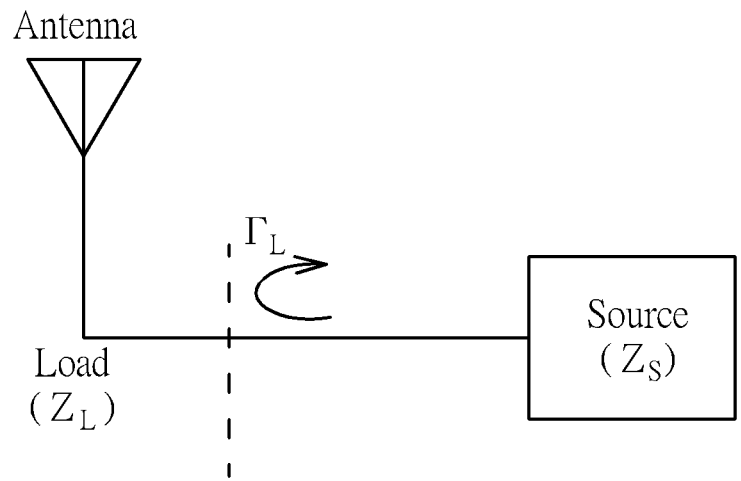
FIG. 2 is a diagram illustrating a simplified model of a system without an antenna tuner.
Figure 3:
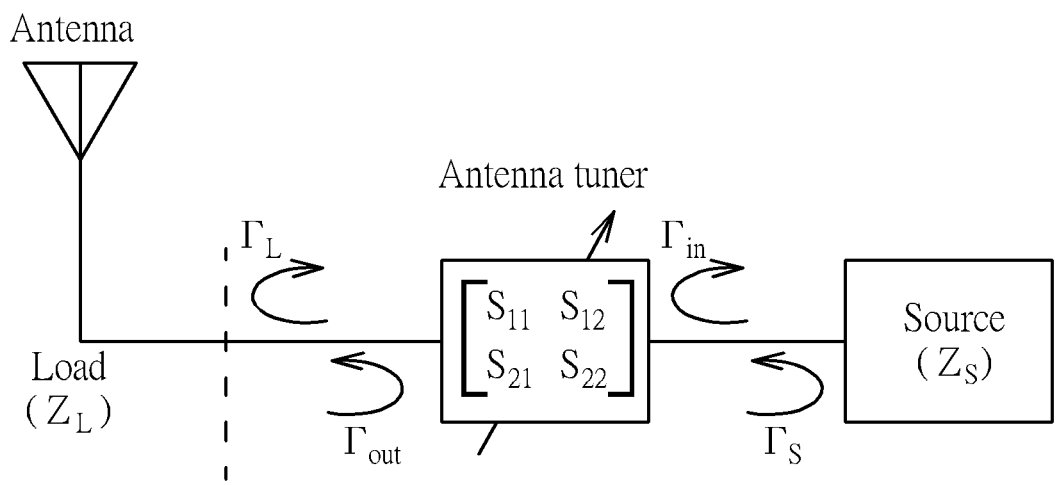
FIG. 3 is a diagram illustrating a simplified model of a system with an antenna tuner.

Please refer to FIG. 2 in conjunction with FIG. 3. FIG. 2 is a diagram illustrating a simplified model of a system without an antenna tuner. FIG. 3 is a diagram illustrating a simplified model of a system with an antenna tuner. As shown in FIG. 2, a transmission line with characteristic impedance $Z_0$ is attached to a load (e.g., an antenna) with impedance $Z_L$. A ratio of the reflected voltage amplitude to that of the forward voltage amplitude is defined as a reflection coefficient usually denoted by the symbol gamma $\Gamma$. The reflection coefficient $\Gamma_L$ can be expressed as $$\frac{Z_L - Z_0}{Z_L + Z_0}.$$

If $Z_L = Z_0$, the transmission line is "matched". In this case, there is no mismatch loss, and a load (e.g., an antenna) obtains maximum external power from a source (e.g., a power amplifier) with a finite internal impedance $Z_0$. The antenna impedance may be affected by the frequency band change and change of user scenarios (e.g. head and hand). The antenna tuner can be used to tune the matching between the source and the load for maximizing the delivered power to the load. That is, the goal of the antenna tuner is to maximize a transducer gain $G_T$. The antenna tuner is a two-port device which can be described using S-parameters $S_{11}, S_{12}, S_{21}, S_{22}$. The transducer gain $G_T$ is defined as $$\frac{\text{delivered power to load}}{\text{available power from source}},$$

and therefore can be expressed using the following formula.

$$G_T = \qquad (1)$$

$$\frac{|S_{21}|^2(1-|\Gamma_S|^2)(1-|\Gamma_L|^2)}{|(1-S_{11}\Gamma_S)(1-S_{22}\Gamma_L)-S_{21}S_{12}\Gamma_L\Gamma_S|} = \frac{|S_{21}|^2(1-|\Gamma_S|^2)(1-|\Gamma_L|^2)}{|1-\Gamma_S\Gamma_{in}|^2|1-S_{22}\Gamma_L|^2}$$

As shown in FIG. 3, a transmission line with characteristic impedance $Z_0$ is attached to the source (e.g., power amplifier) with impedance $Z_S$. Assuming that there is perfect source impedance matching (i.e., $$\left(\text{i.e., } \Gamma_S = \frac{Z_S - Z_0}{Z_S + Z_0} = 0\right),$$

the formula (1) can be simplified as follows.

$$G_T = \frac{|S_{21}|^2(1-|\Gamma_L|^2)}{|1-S_{22}\Gamma_L|^2} \qquad (2)$$

The relative transducer gain RTG is referred to as transducer gain improvement. The relative transducer gain RTG is defined as $$\frac{\text{incident power to antenna } w/\text{antenna tuner}}{\text{incident power to antenna } w/o \text{ antenna tuner}},$$

and can be expressed using the following formula.

$$RTG = \frac{|S_{21}|^2}{|1-S_{22}\Gamma_L|^2} \qquad (3)$$

As mentioned above, the hybrid control algorithm includes an RTG-based search algorithm and a VSWR-based search algorithm. Specifically, the processing circuit 122 performs the VSWR-based search algorithm to find the second control setting CS_2 after a desired analytical computation result (i.e., the first control setting CS_1) is obtained from the RTG-based search algorithm. The analytical computation result (i.e., first control setting CS_1) is sent to the antenna tuner 132 to initialize the VSWR-based search. In other words, the VSWR-based search is performed under the condition that the setting of the antenna tuner 132 is adjusted in response to the analytical computation result (i.e., first control setting CS_1). Concerning the RTG-based search algorithm, the processing circuit 122 finds the control setting CS_1 from a plurality of candidate control settings that can make the RTG value have a maximum value.

As can be seen from above formula (3), the computation of the relative transducer gain RTG requires values of S-parameters $S_{21}$ and $S_{22}$ of the antenna tuner 132 and a value of the antenna gamma (i.e., reflection coefficient $$\Gamma_L = \frac{Z_L - Z_0}{Z_L + Z_0}).$$

In this embodiment, the processing circuit 122 may perform antenna gamma estimation to measure antenna gamma phase and antenna gamma amplitude based on detector inputs provided by the detection circuit 116, and then obtain an estimate of the reflection coefficient $\Gamma_L$. As the structure of the impedance tuning circuit 138 implemented in the antenna tuner 132 and the circuit element values (e.g., nominal inductance values and nominal capacitance values provided by the antenna tuner vendor) are known beforehand, the values of S-parameters $S_{21}$ and $S_{22}$ under different control settings can be obtained. Assume that the matching network 139 has N tunable capacitors controlled by the control words $CW_1$-$CW_N$, respectively, and each of the tunable capacitors has 64 adjustment steps, where N is a positive integer. Hence, each of the tunable capacitors supports 64 capacitance values, and each of the control words $CW_1$-$CW_N$ supports 64 control values. One control setting of the antenna tuner 132 includes values of the control words $CW_1$-$CW_N$. The antenna tuner 132 supports $64^N$ candidate control settings, each corresponding to a combination of N values for control words $CW_1$-$CW_N$. In one exemplary design, an exhaustive search may be employed to check RTG values calculated for all of the candidate control settings, and then find a largest calculated RTG value from the calculated RTG values. The candidate control setting associated with the largest calculated RTG value is selected as the first control setting CS_1.

It should be noted that, antenna gamma estimation is not perfect. In addition, due to process variation and temperature variation, the nominal circuit element values (e.g., nominal capacitance values of tunable capacitors and nominal inductance values of inductors) of the impedance tuning circuit 138 implemented in the antenna tuner 132 may be different from actual circuit element values possessed by the impedance tuning circuit 138 implemented in the antenna tuner 132. For example, deviation of the circuit element value may be +/−20%. Since the RTG values are calculated based on the nominal circuit element values and estimated antenna gamma rather than the actual circuit element values and actual antenna gamma value, the first control setting CS_1 may not be the optimum control setting that can truly achieve the actual global maximum RTG value. That is, the largest calculated RTG value is a nominal global maximum RTG value, and may not the same as the real global maximum RTG value.

For a reasonable designed antenna tuner network, one or more control settings associated with local minimum VSWR values are around an optimal control setting associated with the real global maximum RTG value. If there is a way to initialize a start search point around the optimal control setting associated with the real global RTG maximum value, the local minimum VSWR search will find a control word close to the optimal control word. This can provide robustness against the circuit element variation of the antenna tuner (i.e., the model parameter deviation). The present invention therefore proposes using the VSWR-based search algorithm to find the second control setting CS_2 which is better than the first control setting CS_1.

The processing circuit 122 outputs the first control setting CS_1 to change the setting of the antenna tuner 132, and then observes change of VSWR to proceed with the local minimum VSWR search. The processing circuit 122 may calculate the VSWR value based on detector inputs provided by the detection circuit 116. In addition, after using the first control setting CS_1 as a search start point, the processing circuit 122 may employ any feasible local minimum search method to find the second control setting CS_2 corresponding to a local minimum VSWR value. For example, the processing circuit 122 may be configured to use the hill climbing method to find the second control setting CS_2. In an ideal condition that there is no process variation, temperature variation and non-perfect antenna estimation, the derived first control setting CS_1 is just an optimal control word. Compared to the first control setting CS_1, the second control setting CS_2 can be very close to the optimal control word that can almost achieve the real global maximum RTG value. In a practical condition that there is process variation, temperature variation, and/or non-perfect antenna estimation, compared to the first control setting CS_1, the second control setting CS_2 can usually be closer to the optimal control word that can truly achieve the real global maximum RTG value. Hence, local minimum VSWR search could be a comprehensive and robust method.

It should be noted that if the search start point is not properly initialized, starting the VSWR-based search operation from a random control setting or a control setting currently used by the antenna tuner 132 may not reach the optimal control setting. Specifically, there are several local minimum VSWR values on a VSWR surface defined by all possible control settings of the antenna tuner 132. Since the VSWR surface is complicated, the search direction could be wrong without proper initialization. Further, a global minimum VSWR value (i.e., the minimum of all local minimum VSWR values) does not always correspond to a real global maximum RTG value. If a global minimum VSWR search is used, setting the final control setting CS_F based on the global minimum VSWR value may not achieve the real global maximum RTG value.

In conclusion, the present invention uses a local minimum VSWR search rather than a global minimum VSWR search. To improve the search accuracy of the local minimum VSWR search, the present invention uses the RTG-based analytical computation to decide a search start point of the local minimum VSWR search. More specifically, the local minimum VSWR search is more robust than the RTG-based analytical computation, and initializing a search start point of the local minimum VSWR search by a result of the RTG-based analytical computation allows the local minimum VSWR search to get a better chance to reach the optimal control setting.

Figure 4:
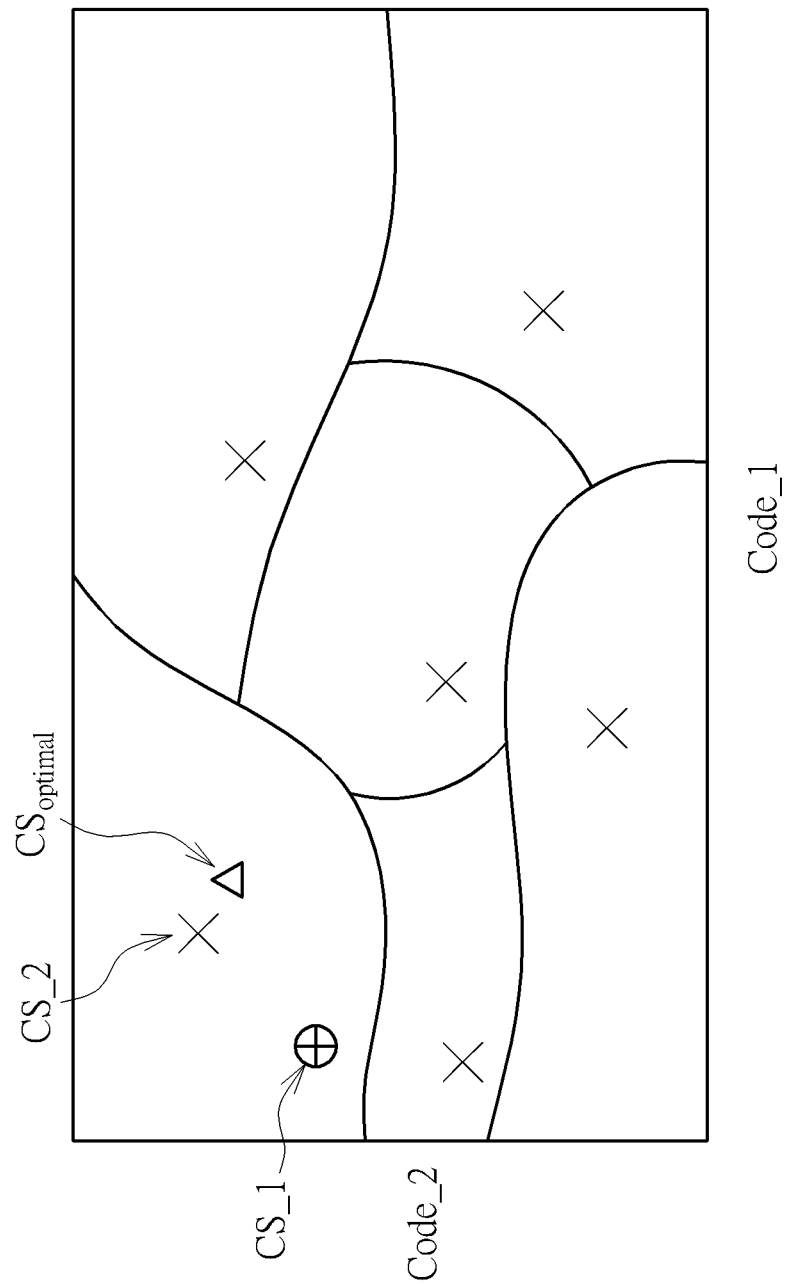
FIG. 4 is a diagram illustrating an example of the first and second control settings determined by the processing circuit shown in FIG. 1.

FIG. 4 is a diagram illustrating an example of the first and second control settings CS_1 and CS_2 determined by the processing circuit 122 shown in FIG. 1. For clarity and simplicity, it is assumed that the antenna tuner 132 has only two tunable capacitors controlled by two control words Code_1 and Code_2, respectively. The symbol "x" represents a control word associated with a local minimum VSWR value, the symbol "⊕" represents a control word associated with the nominal global maximum RTG value, and the symbol "Δ" represents a control word associated with the real global maximum RTG value. Moreover, the boundary shows that no matter which point within the region inside it is used as a start point of local minimum VSWR search, the convergence points would always be the same control word associated with a local minimum VSWR value. As there are several local minimum VSWR values, the nominal global maximum RTG value found using the analytical computation can decide which one of the local minimum VSWR values is the target required to be searched for by the local minimum VSWR search. In other words, using the first control setting CS_1 as the search start point can ensure a correct search area/direction for the local minimum VSWR search. Compared to the analytical computation based on nominal circuit element values, the hybrid algorithm with the local minimum VSWR search is more robust against circuit element variations or error of antenna estimation. Hence, with proper initialization, the local minimum VSWR search can obtain a control setting (i.e., CS_2) close to the optical control setting $CS_{optimal}$.

Figure 5:
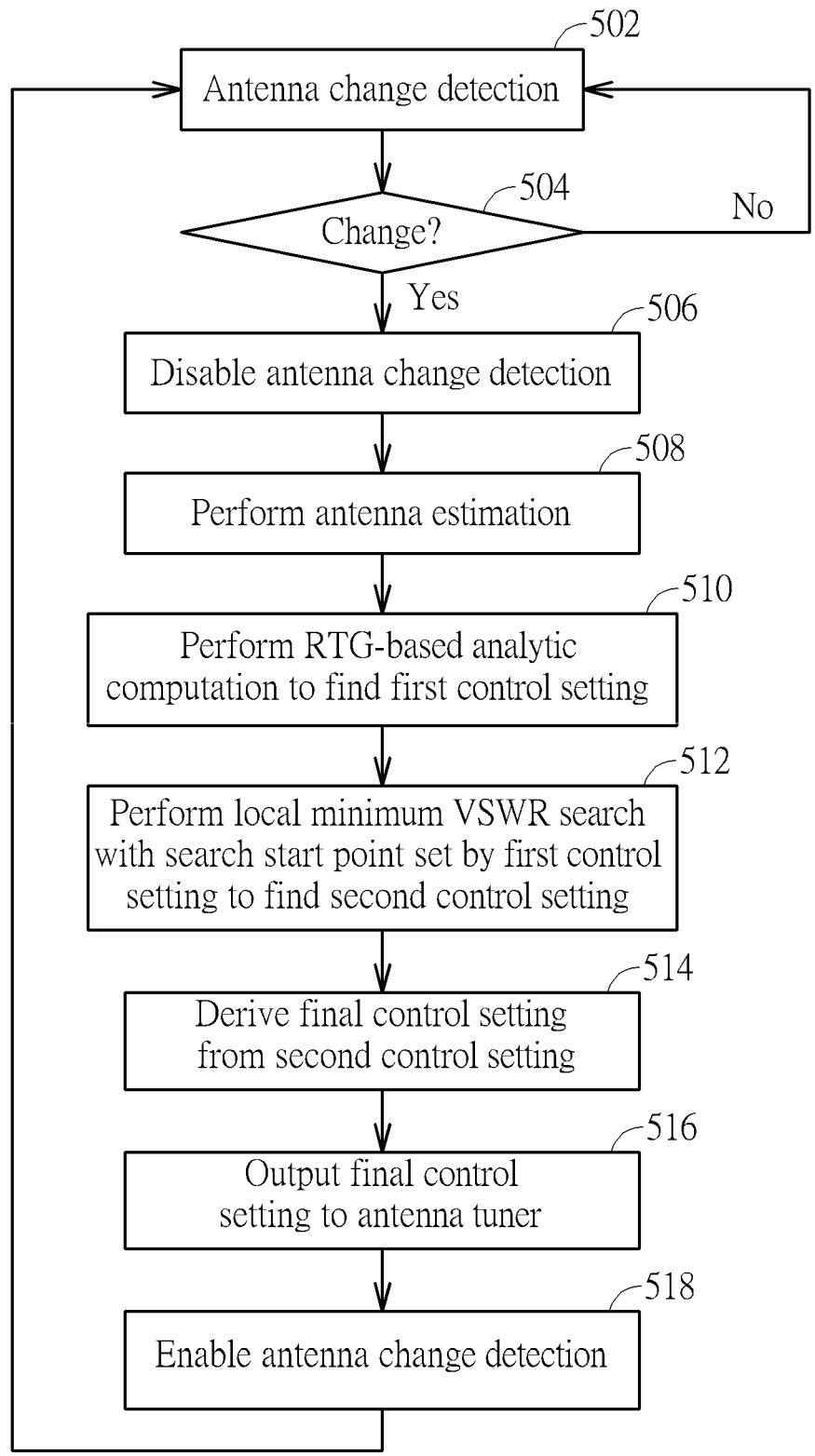
FIG. 5 is a flowchart illustrating an antenna tuning control method according to an embodiment of the present invention.

FIG. 5 is a flowchart illustrating an impedance tuning control method according to an embodiment of the present invention. The impedance tuning control method may be employed by the impedance tuning control apparatus 112 shown in FIG. 1 for antenna tuning. Provided that the result is substantially the same, the steps are not required to be executed in the exact order shown in FIG. 5. The impedance tuning control method may be briefly summarized as below.

Step 502: Perform antenna change detection.

Step 504: Check if an antenna change event occurs. If yes, go to step 506; otherwise, go to step 502.

Step 506: Disable the antenna change detection.

Step 508: Perform antenna estimation.

Step 510: Perform RTG-based analytical computation to find a first control setting.

Step 512: Perform a local minimum VSWR search with a search start point set by the first control setting to find a second control setting.

Step 514: Derive a final control setting from the second control setting. For example, the second control setting may be directly used as the target control setting.

Step 516: Output the final control setting to an antenna tuner.

Step 518: Enable the antenna change detection, and go to step 502.

The antenna loading may change due to certain factors. For example, when the human body condition is different and/or the environmental condition is different, the antenna loading may be different. Hence, the current control setting applied to the antenna tuner 132 should be adjusted in response to an antenna change event for keeping the antenna performance at the desired level. On the contrary, when the antenna change event is not detected, the current control setting applied to the antenna tuner 132 remains intact. For example, the antenna change detection performed by the processing circuit 122 may be implemented by detecting if there is a large power change which is indicative of an antenna change event. In one exemplary design, the antenna change detection may be implemented by detecting the change of the measured VSWR value. The antenna change detection is disabled after the current antenna change event is detected, and is enabled after the final control setting is sent to the antenna tuner 132 in response to the current antenna change event. As a person skilled in the art can readily understand details of each step shown in FIG. 5 after reading above paragraphs, further description is omitted for brevity.

As mentioned above, the antenna estimation (step 508) is performed by the processing circuit 122 to estimate the antenna gamma (i.e., reflection coefficient $$\left(\text{i.e., reflection coefficient } \Gamma_L = \frac{Z_L - Z_0}{Z_L + Z_0}\right)$$

that is involved in determining the first control setting CS_1. Hence, the accuracy of the first control setting CS_1 depends on the correct antenna estimation. As the first control setting CS_1 acts as a search start point of the VSWR-based local minimum search operation, the accuracy of the second control setting CS_2 also depends on the correct antenna estimation. The processing circuit 122 would generate a measured reflection coefficient according to detector inputs generated from the detection circuit 116, which is very different from antenna reflection coefficient because it may be affected by all modules between antenna and detector input. For example, the modules between antenna and detector input may include coupler, transmission line and antenna tuner 132. The present invention further proposes compensation in measured reflection coefficient to improve antenna estimation accuracy.

To mitigate the impact resulting from all modules between antenna and detector input, the present invention proposes applying compensation to a measured reflection coefficient. For example, the processing circuit 122 obtains a measured reflection coefficient, and generates a compensated reflection coefficient (i.e., an estimated antenna reflection coefficient) involved in determining the first control setting CS_1 by compensating the measured reflection coefficient according to at least one factor of the coupler 117. For example, the at least one factor of the coupler 117 may include S-parameter $S_{21}$ and directivity D. When S-parameters of the coupler 117 (which is a 4-port device) are considered in the antenna estimation, the relation between the measured reflection coefficient $\hat{\Gamma}_L$ and the compensated reflection coefficient $\Gamma_L$ can be expressed using following formula.

$$\Gamma_L = \frac{1}{S_{21}} \frac{S_{31}\hat{\Gamma}_L - S_{41}}{(S_{42} - S_{32}\hat{\Gamma}_L) + \frac{S_{22}S_{31}}{S_{21}}\Gamma_L - \frac{S_{22}S_{41}}{S_{21}}} \quad (4)$$

Since some S-parameters of the coupler 117 would be generally designed to be small or close to 1, formula (4) may be simplified as follows.

$$\Gamma_L \approx \frac{1}{S_{21}}(\hat{\Gamma}_L - D) \quad (5)$$

where coupler directivity D equals S41/S31. In one exemplary design, the S-parameter $S_{21}$ and directivity D in formula (5) may be directly set by nominal values provided by a coupler vendor to compensate for the coupler impact. In another exemplary design, values of the S-parameter $S_{21}$ and directivity D may be calibrated and then used in formula (5) to compensate for the coupler impact. Preferably, different values of S-parameter $S_{21}$ and directivity D are used for different frequencies. For example, the processing circuit 122 may include an S-parameter table recording a plurality of nominal values indexed by different frequencies (e.g., low, middle and high frequencies), and further include a directivity table recording a plurality of nominal values indexed by different frequencies (e.g., low, middle and high frequencies).

It should be noted that using compensation to mitigate the impact resulting from the coupler 117 between antenna and detector input is only one embodiment of the present invention. The same compensation concept mentioned above may be employed to mitigate the impact resulting from any module between antenna and detector input. This also falls within the scope of the present invention.

To mitigate the impact resulting from the circuit element variations (e.g., capacitance variations of the tunable capacitors) in the antenna tuner 132, the present invention proposes configuring the antenna tuner 132 by a pre-defined control setting $CS_Z$. For example, the processing circuit 122 generates the pre-defined control setting $CS_Z$ to the antenna tuner 132 via the output circuit 124, and performs antenna estimation to determine an antenna reflection coefficient involved in determining the first control setting CS_1 when the antenna tuner 132 is configured by the pre-defined control setting $CS_Z$. In one exemplary design, at least one tunable element in the antenna tuner 132 is configured to have a smallest element value in response to the pre-defined control setting $CS_Z$. For example, at least a portion (i.e., part or all) of the tunable capacitors in the matching network 139 may be controlled to have smallest capacitance values. It should be noted that the pre-defined control setting $CS_Z$ should be configured based on a capacitor model of each tunable capacitor used in the antenna tuner 104. For example, the tunable capacitors are implemented using SOI (Silicon On Insulator) capacitors. In addition to SOI capacitors, most commercial tunable capacitors are composed of several pairs of small capacitors in parallel, and the capacitance value of one tunable capacitor depends on on/off status of each small capacitor. Admittance of small capacitor of on state and off state could be approximately modeled as Ya_on and Ya_off respectively. In addition, admittance of a tunable capacitor equals sum of admittance of all small capacitors. Hence, a tunable capacitor approximate model may be expressed as below.

$$Ya = Ya\_on - Ya\_off) \times code\_word + max\_code\_word \times Ya\_off \quad (6)$$

In above formula (6), the capacitance value Ya is determined by parameters Ya_on, Ya_off, a value of the control word code_word, and a maximum value of the control word max_code_word. Clearly, parameters related to an on-state (with larger variation amount normally) are not active when the value of the control word code_word is set to zero, while parameters related to an off-state (with smaller variation amount normally) are active. Thus, the impact resulting from capacitance variations can be mitigated or avoided. Based on such observation, each of the control words $CW_1$-$CW_N$ may be set by a zero value under the control of the pre-defined control setting $CS_Z$. In this way, a more accurate antenna estimation result can be obtained.

As mentioned above, the processing circuit 122 may employ a hill climbing method to find the second control setting CS_2 during the local minimum VSWR search procedure. However, the number of search variables is usually larger than one. Consider a case where the matching network 139 has three tunable capacitors controlled by control words $CW_1$-$CW_N$ (N=3). Hence, the number of search dimensions is equal to three, and each control setting is a combination of values of the control words $CW_1$-$CW_3$. As a result, the iteration of the hill climbing method needs to check six candidate control settings around a current candidate control setting at most to decide a search direction from the current candidate control setting. The computation effort is significantly increased when the number of search dimensions is larger.

To simplify the local minimum VSWR search, the present invention proposes fixing a value of a code word in one search dimension when the code word in the first control setting CS_1 has a boundary value (e.g., a minimum value or a maximum value). This is based on one key observation that, with reasonable degree of variation, as long as the optimal control setting $CS_{optimal}$ has boundary values of one or more code words, the first control setting CS_1 also has boundary value in the same position as $CS_{optimal}$. Hence, when a control word in the first control setting CS_1 is set by its boundary value, each candidate control setting checked by the local minimum VSWR search can be intentionally set to thereby have part of the control words fixed at the boundary value. Since there is no need to check other values of the control word with the fixed boundary value during the local minimum VSWR search, the number of search dimensions is reduced. Specifically, the local minimum VSWR search only needs to search for any code word that does not have a boundary value initially. The computation effort is reduced correspondingly.

The local minimum search efficiency can be further improved by pruning. For example, assuming that a specific candidate control setting previously checked by the local minimum search operation under a specific antenna loading makes the second antenna performance metric have a metric value beyond a predetermined range (e.g., a VSWR value is too large), the processing circuit 122 generates a search list $L_1$ of candidate control settings corresponding to the antenna loading by pruning away the specific candidate control setting in the search list $L_1$. In this way, the number of candidate control settings to be checked by the local minimum search operation is reduced, thus improving the search efficiency. In addition, the processing circuit 122 may dynamically maintain a list $L_2$ of unfavorable control settings corresponding to the specific antenna loading by adding the specific candidate control setting to the list $L_2$. Hence, the processing circuit 122 may refer to the list $L_2$ to block the specific candidate control setting from being checked again under the specific antenna loading. By way of example, but not limitation, the processing circuit 122 can refer to the list $L_2$ to prune away the specific candidate control setting in the search list $L_1$. Moreover, for different antenna loadings, the processing circuit 122 may dynamically load and use corresponding lists of unfavorable control settings.

For each antenna change event, an initialization of the local minimum VSWR search needs to be performed, and it is a computationally intensive task due to the analytical computation using an exhaustive search. The processing circuit 122 may take a long time to find the first control setting CS_1 for each antenna change event.

The present invention therefore proposes a pre-computation scheme to save the real-time tuning time. For example, the processing circuit 122 is further configured to pre-compute at least one control setting with respect to at least one antenna loading and at least one frequency, and store the control setting in a table $T_1$, where the control setting is determined according to the first antenna performance metric (e.g., the at least one control setting is pre-computed using the RTG-based analytical computation). Hence, the processing circuit 122 refers to the table $T_1$ to load the needed first control setting CS_1 from the pre-computed control setting. In a case where the memory size is not an issue, the processing circuit 122 may pre-compute control settings with respect to all antenna loadings and all frequencies, and store these pre-computed control settings in the table $T_1$. In another case where the memory size is an issue, the processing circuit 122 may pre-compute control settings for possible future antenna loadings based on the current antenna loading, and store these pre-computed control settings in the table $T_1$. Further, the processing circuit 122 may update the table $T_1$ during an idle time. For example, when the processing circuit 122 has finished antenna tuning and is waiting for occurrence of the next antenna change event, the processing circuit 122 may update the table $T_1$.

As mentioned above, the processing circuit 122 may employ an exhaustive search to find the first control setting CS_1 by checking all of the candidate control settings. Consider a case where the matching network 139 has three tunable capacitors controlled by control words $CW_1$-$CW_N$ (N=3), and each of the tunable capacitors has 64 adjustment steps. Hence, each of the tunable capacitors supports 64 capacitance values, and each of the control words $CW_1$-$CW_3$ supports 64 values. The antenna tuner 132 therefore supports $64^3$ candidate control settings.

To speed up the search speed, the processing circuit 122 may employ a hierarchical search to find the first control setting CS_1 by checking part of the candidate control settings only. In one exemplary design, the hierarchical search includes a coarse search operation with a first step size and a fine search operation with a second step size, where the second step size is smaller than the first step size. The processing circuit 122 performs the coarse search operation to find a third control setting CS_3 according to the first antenna performance metric (e.g., RTG), and then performs the fine search operation through the candidate control setting around the third control setting CS_3 to find the first control setting CS_1 according to the first antenna performance metric (e.g., RTG). For example, the first step size is 8, and the second step size is 1. Though each of the control words $CW_1$-$CW_3$ supports 64 values, the coarse search operation only checks 8 values per code word. Thus, the coarse search operation finds the third control setting CS_3 from $8^3$ candidate control settings. After the third control setting CS_3, the fine search operation uses a smaller step size to check some candidate control settings (e.g., $8^3$ candidate control settings) around the third control setting CS_3 to find the first control setting CS_1. Hence, the number of candidate control settings checked for finding the first controls setting CS_1 can be reduced to $8^3+8^3$.

Similarly, the aforementioned search dimension reduction technique may be employed to improve the search speed of the fine search operation. That is, when a control word in the third control setting CS_3 is set by a boundary value (e.g., a minimum value or a maximum value), each candidate control setting checked by the fine search operation is intentionally set to thereby have the control word fixed at the boundary value. Since there is no need to check other values of the control word with the fixed boundary value during the fine search, the number of search dimensions is reduced. Specifically, the fine search only needs to search for some candidate control settings around the third control setting CS_3 that do not have boundary values initially. The computation effort is reduced correspondingly.

Any of the aforementioned formulas (2) and (3) is obtained under the consumption that the source impedance has perfect matching, i.e., $$\Gamma_S = \frac{Z_S - Z_0}{Z_S + Z_0} \approx 0.$$

However, if there is source impedance mismatch, using the simplified formula will lead to a wrong control setting and a bad RTG value. It should be noted that the transducer gain $G_T$ is defined as $$\frac{\text{delivered power to load}}{\text{available power from source}},$$

and can also be expressed using the following formula.

$$G_T = \qquad (7)$$
$$\frac{|S_{21}|^2(1-|\Gamma_S|^2)(1-|\Gamma_L|^2)}{|(1-S_{11}\Gamma_S)(1-S_{22}\Gamma_L) - S_{21}S_{12}\Gamma_L\Gamma_S|} = \frac{|S_{21}|^2(1-|\Gamma_S|^2)(1-|\Gamma_L|^2)}{|1-\Gamma_L\Gamma_{out}|^2|1-S_{11}\Gamma_S|^2}$$

Hence, in accordance with formulas (1) and (7), maximum transducer gain is achieved when the input and output of the matching network in the antenna tuner are conjugate matching the source impedance and the load impedance, respectively. That is, maximum transducer gain is achieved when $\Gamma_{in}=\Gamma_S^*$ and $\Gamma_{out}=\Gamma_L^*$. If the source impedance has perfect matching, the second control setting CS_2 can be directly used as the final control setting CS_F. If there is source impedance mismatch, the present invention further proposes estimating the source impedance, and then finding the final control setting CS_F according to at least the second control setting CS_2 and the source impedance estimation result.

One strategy of estimating the source reflection may use the fact that the output reflection is approximately equal to the conjugate of antenna reflection, i.e., $$\Gamma_L^* \approx \Gamma_{out} = S_{22} + \frac{S_{12}S_{21}\Gamma_S}{1-S_{11}\Gamma_S}.$$

Hence, $$\Gamma_S = \frac{\Gamma_L^* - S_{22}}{(\Gamma_L^* - S_{22})S_{11} + S_{12}S_{21}}.$$

Another strategy of estimating the source impedance is to use the magnitude of forward incident power wave (i.e., $|b_1'|$) to the matching network in the antenna tuner to determine the real part $R_S$ of the source impedance. For example, the source impedance can be estimated using the following formula.

$$[1-(\Gamma_{in}+\Gamma_{in}^*)]R_S^2 + 2R_S Z_0 - \qquad (8)$$
$$2jZ_0(\Gamma_{in}-\Gamma_{in}^*)I_S + [1+(\Gamma_{in}+\Gamma_{in}^*)]Z_0^2 - \frac{Z_0}{|b_1'|^2} = 0$$

In reality, only the magnitude of the incident wave (i.e., $|b_1'|$) can be reliably estimated. Therefore, only the real part $R_S$ (or imaginary part $I_S$) of the source impedance can be computed. When $(\Gamma_{in}-\Gamma_{in}^*)$ is small, the above formula (8) can be simplified as below.

$$[1-(\Gamma_{in}+\Gamma_{in}^*)]R_S^2 + 2R_S Z_0 + [1+(\Gamma_{in}+\Gamma_{in}^*)]Z_0^2 - \frac{Z_0}{|b_1'|^2} = 0 \qquad (9)$$

Therefore, the present invention may perform the source impedance estimation after the local minimum VSWR search finds the second control setting CS_2 that makes $\Gamma_{in}$ small. When the option of source impedance estimation is not open, a simplified transducer gain formula is used, and the processing circuit 122 outputs the second control setting CS_2 as the final control setting CS_F. When the option of source impedance estimation is open, a complete transducer gain formula is used after a source impedance estimation result is obtained. For example, the processing circuit 122 estimates source impedance when the antenna tuner 132 is configured by the second control setting CS_2, determines a third control setting CS_3' according to the first antenna performance metric (e.g., RTG) and a source impedance estimation result, and perform another search operation (e.g., local minimum VSWR search) with a search start point set by the third control setting CS_3' to find the final control setting CS_F according to the second antenna performance metric (e.g., VSWR). The first local minimum VSWR search performed before source impedance estimation is to make the reflection coefficient $\Gamma_{in}$ close to a minimum value, and the second local minimum VSWR search performed after source impedance estimation is to make the reflection coefficient $\Gamma_{in}$ close to the conjugate of reflection coefficient $\Gamma_S$. In this way, a better control value can be found under a condition that there is source impedance mismatch.

Figure 6:
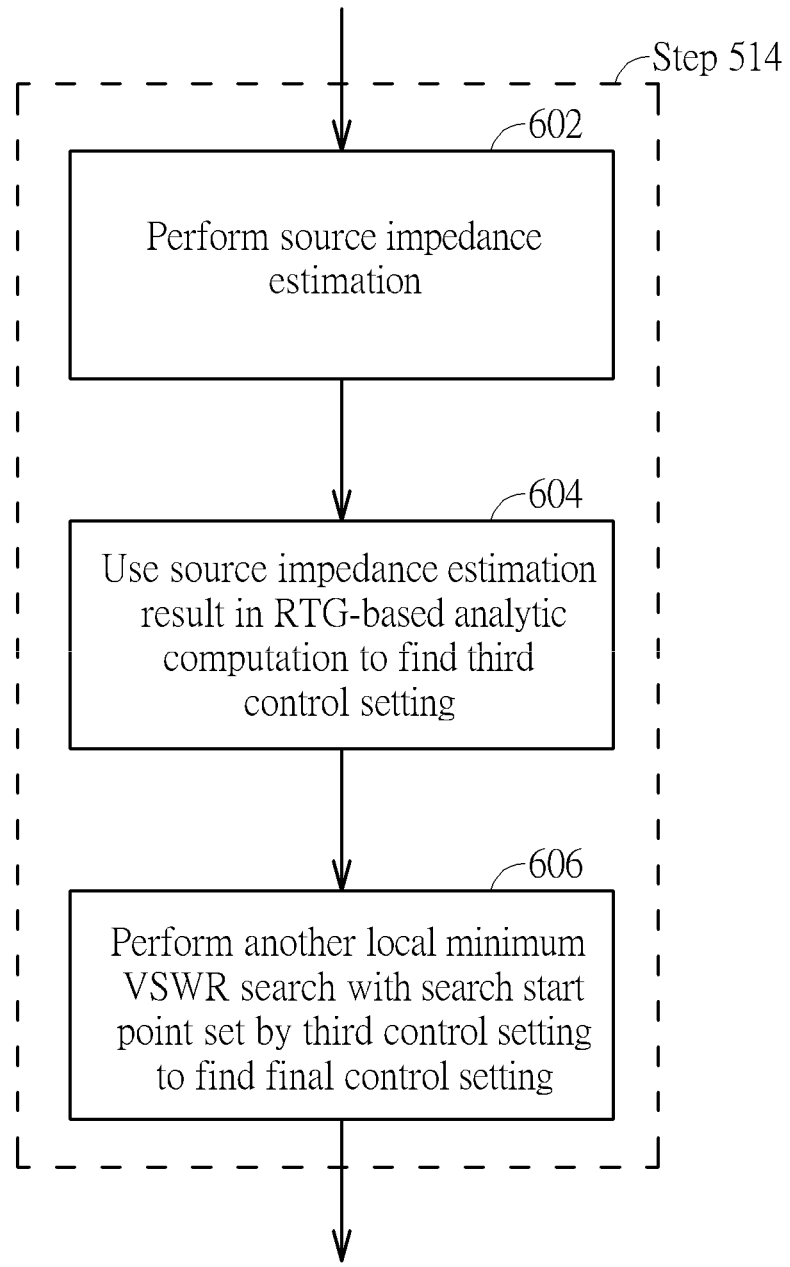
FIG. 6 is a diagram illustrating an alternative design of step 514 shown in FIG. 5.

When the source impedance mismatch is taken into consideration, step 514 may be implemented using following steps shown in FIG. 6.

Step 602: Perform source impedance estimation.

Step 604: Use a source impedance estimation result in an RTG-based analytical computation to find a third control setting.

Step 606: Perform another local minimum VSWR search with a search start point set by the third control setting to find the final control setting.

As a person skilled in the art can readily understand details of each step shown in FIG. 6, further description is omitted for brevity.

In conclusion, the proposed closed-loop antenna tuning with local minimum VSWR search together with initialization from analytical computation can find an adequate control setting for an antenna tuner. With initialization (i.e., setting of a search start point) provided by the analytical computation, the local minimum VSWR search is more likely to converge to a control setting close to an optimal control setting. Compared to the analytical computation, the local minimum VSWR search is more robust against the parameter deviation of the antenna tuner or error of antenna impedance estimation. Hence, the proposed hybrid control algorithm combines the benefits from local search and analytical computation. Further, the proposed hybrid control algorithm may be modified to include the source impedance estimation to effectively handle the case that the source impedance (e.g., the PA output impedance) is not equal to the characteristic impedance of the transmission line.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An impedance tuning control apparatus, comprising:
    a processing circuit, configured to refer to first performance metrics of a plurality of candidate control settings to select a first control setting from the candidate control settings, and perform a search operation with a search start point set by the first control setting to find a second control setting according to a second performance metric different from the first performance metric; and an output circuit, configured to output a final control setting to a tuner, wherein the final control setting is derived from the second control setting;

wherein the processing circuit is further configured to generate a pre-defined control setting to the tuner via the output circuit, and perform antenna estimation to determine a reflection coefficient involved in determining the first control setting when the tuner is configured by the pre-defined control setting.

2. The impedance tuning control apparatus of claim 1, wherein the first performance metric includes a transducer gain or a relative transducer gain.

3. The impedance tuning control apparatus of claim 1, wherein the processing circuit determines the first control setting by performing analytical computation based on the first performance metric.

4. The impedance tuning control apparatus of claim 1, wherein the second performance metric includes a voltage standing wave ratio (VSWR) or a reflection coefficient amplitude/phase.

5. The impedance tuning control apparatus of claim 1, wherein the search operation is a local minimum search operation.

6. The impedance tuning control apparatus of claim 1, wherein the processing circuit is further configured to perform antenna estimation to determine a measured reflection coefficient, and generate an estimated reflection coefficient involved in determining the first control setting by compensating the measured reflection coefficient according to at least one factor of at least one module between an antenna and a detector input.

7. The impedance tuning control apparatus of claim 1, wherein at least one tunable element in the tuner is configured to have a smallest element value in response to the pre-defined control setting.

8. The impedance tuning control apparatus of claim 1, wherein each control setting includes at least a control word of a corresponding tunable element in the tuner; and when the control word in the first control setting is set by a boundary value, each candidate control setting checked by the search operation has the control word fixed at the boundary value.

9. The impedance tuning control apparatus of claim 1, wherein the processing circuit is further configured to pre-compute at least one control setting with respect to at least one loading and at least one frequency, where the at least one control setting is determined according to the first performance metric; and the processing circuit is further configured to load the first control setting from the at least one control setting.

10. The impedance tuning control apparatus of claim 1, wherein the processing circuit is configured to perform a coarse search operation to find a third control setting according to the first performance metric, and performs a fine search operation through a candidate control setting around the third control setting to find the first control setting according to the first performance metric; a second step size used by the fine search operation is smaller than a first step size used by the coarse search operation.

11. The impedance tuning control apparatus of claim 10, wherein each control setting includes at least a control word of a corresponding tunable element in the tuner; and when the control word in the third control setting is set by a boundary value, each candidate control setting checked by the fine search operation has the control word fixed at the boundary value.

12. An impedance tuning control apparatus, comprising:
a processing circuit, configured to refer to first performance metrics of a plurality of candidate control settings to select a first control setting from the candidate control settings, and perform a search operation with a search start point set by the first control setting to find a second control setting according to a second performance metric different from the first performance metric; and
an output circuit, configured to output a final control setting to a tuner, wherein the final control setting is derived from the second control setting;
wherein a candidate control setting previously checked by the search operation under a loading makes the second performance metric have a metric value beyond a predetermined range, and the processing circuit is further configured to generate a search list of candidate control settings corresponding to the loading by pruning away the candidate control setting in the search list.

13. An impedance tuning control apparatus, comprising:
a processing circuit, configured to refer to first performance metrics of a plurality of candidate control settings to select a first control setting from the candidate control settings, and perform a search operation with a search start point set by the first control setting to find a second control setting according to a second performance metric different from the first performance metric; and
an output circuit, configured to output a final control setting to a tuner, wherein the final control setting is derived from the second control setting;
wherein a candidate control setting previously checked by the search operation under a loading makes the second performance metric have a metric value beyond a predetermined range, and the processing circuit is further configured to dynamically maintain a list of unfavorable control settings corresponding to the loading by adding the candidate control setting to the list of unfavorable control settings, and refer to the list of unfavorable control settings to block the candidate control setting from being checked again under the loading.

14. An impedance tuning control apparatus, comprising:
a processing circuit, configured to refer to first performance metrics of a plurality of candidate control settings to select a first control setting from the candidate control settings, and perform a search operation with a search start point set by the first control setting to find a second control setting according to a second performance metric different from the first performance metric; and
an output circuit, configured to output a final control setting to a tuner, wherein the final control setting is derived from the second control setting;
wherein the processing circuit is further configured to estimate a source impedance when the tuner is configured by the second control setting, determine a third control setting according to the first performance metric and a source impedance estimation result, and perform another search operation with a search start point set by the third control setting to find the final control setting according to the second performance metric.

15. An impedance tuning control method, comprising:
referring to first performance metrics of a plurality of candidate control settings to select a first control setting from the candidate control settings;

performing a search operation with a search start point set by the first control setting to find a second control setting according to a second performance metric different from the first performance metric;
controlling a tuner based on a final control setting derived from the second control setting; and
generating a pre-defined control setting to the tuner; and when the tuner is configured by the pre-defined control setting, performing antenna estimation to determine a reflection coefficient involved in determining the first control setting.

16. The impedance tuning control method of claim 15, wherein the first performance metric includes a transducer gain or a relative transducer gain.

17. The impedance tuning control method of claim 15, wherein determining the first control setting comprises:
determining the first control setting by performing an analytical computation based on the first performance metric.

18. The impedance tuning control method of claim 15, wherein the second performance metric includes a voltage standing wave ratio (VSWR) or a reflection coefficient amplitude/phase.

19. The impedance tuning control method of claim 15, wherein the search operation is a local minimum search operation.

20. The impedance tuning control method of claim 15, further comprising:
performing antenna estimation to determine a measured reflection coefficient; and
generating an estimated reflection coefficient involved in determining the first control setting by compensating the measured reflection coefficient according to at least one factor of at least one module between an antenna and a detector input.

21. The impedance tuning control method of claim 15, wherein at least one tunable element in the tuner is configured to have a smallest element value in response to the pre-defined control setting.

22. The impedance tuning control method of claim 15, wherein each control setting includes at least a control word of a corresponding tunable element in the tuner; and performing the search operation further comprises:
when the control word in the first control setting is set by a boundary value, keeping the control word in each candidate control setting checked by the search operation fixed at the boundary value.

23. The impedance tuning control method of claim 15, wherein determining the first control setting comprises:
pre-computing at least one control setting with respect to at least one loading and at least one frequency, where the at least one control setting is determined according to the first performance metric; and
loading the first control setting from the at least one control setting.

24. The impedance tuning control method of claim 15, wherein a coarse search operation has a first step size; a fine search operation has a second step size smaller than the first step size; and determining the first control setting according to the first performance metric comprises:
performing the coarse search operation to find a third control setting according to the first performance metric; and
performing the fine search operation through a candidate control setting around the third control setting to find the first control setting according to the first performance metric.

25. The impedance tuning control method of claim 24, wherein each control setting includes at least a control word of a corresponding tunable element in the tuner; and when the control word in the third control setting is set by a boundary value, each candidate control setting checked by the fine search operation has the control word fixed at the boundary value.

26. An impedance tuning control method, comprising:
referring to first performance metrics of a plurality of candidate control settings to select a first control setting from the candidate control settings;
performing a search operation with a search start point set by the first control setting to find a second control setting according to a second performance metric different from the first performance metric; and
controlling a tuner based on a final control setting derived from the second control setting;
wherein a candidate control setting previously checked by the search operation under a loading makes the second performance metric have a metric value beyond a predetermined range, and performing the search operation further comprises:
generating a search list of candidate control settings corresponding to the loading by pruning away the candidate control setting in the search list.

27. An impedance tuning control method, comprising:
referring to first performance metrics of a plurality of candidate control settings to select a first control setting from the candidate control settings;
performing a search operation with a search start point set by the first control setting to find a second control setting according to a second performance metric different from the first performance metric; and
controlling a tuner based on a final control setting derived from the second control setting;
wherein a candidate control setting previously checked by the search operation under a loading makes the second performance metric have a metric value beyond a predetermined range; and the impedance tuning control method further comprises:
dynamically maintaining a list of unfavorable control settings corresponding to the loading by adding the candidate control setting to the list of unfavorable control settings; and
referring to the list of unfavorable control settings to block the candidate control setting from being checked again under the loading.

28. An impedance tuning control method, comprising:
referring to first performance metrics of a plurality of candidate control settings to select a first control setting from the candidate control settings;
performing a search operation with a search start point set by the first control setting to find a second control setting according to a second performance metric different from the first performance metric;
controlling a tuner based on a final control setting derived from the second control setting;
estimating a source impedance when the tuner is configured by the second control setting;
determine a third control setting according to the first performance metric and a source impedance estimation result; and
performing another search operation with a search start point set by the third control setting to find the final control setting according to the second performance metric.

29. An impedance tuning control apparatus, comprising:
a processing circuit, configured to determine a first control setting according to a first performance metric, and perform a search operation with a search start point set by the first control setting to find a second control setting according to a second performance metric different from the first performance metric; and
an output circuit, configured to output a final control setting to a tuner, wherein the final control setting is derived from the second control setting;
wherein the processing circuit is further configured to generate a pre-defined control setting to the tuner via the output circuit, and perform antenna estimation to determine a reflection coefficient involved in determining the first control setting when the tuner is configured by the pre-defined control setting;
wherein the pre-defined control setting is configured based on a plurality of capacitors comprised in the tuner.

* * * * *